(12) United States Patent
Kyles et al.

(10) Patent No.: US 6,559,682 B1
(45) Date of Patent: May 6, 2003

(54) DUAL-MIXER LOSS OF SIGNAL DETECTION CIRCUIT

(75) Inventors: Ian Kyles, West Linn, OR (US); Tao Xiang, Thousand Oaks, CA (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 10/159,648

(22) Filed: May 29, 2002

(51) Int. Cl.[7] .................................................. H03K 5/19
(52) U.S. Cl. ........................... 327/20; 327/349; 327/355
(58) Field of Search ......................... 327/20, 350, 352, 327/355–357, 353–361, 65, 346, 349

(56) References Cited

U.S. PATENT DOCUMENTS

| | | | | |
|---|---|---|---|---|
| 4,982,119 A | * | 1/1991 | Tateishi | 327/65 |
| 5,329,115 A | | 7/1994 | Lim | 250/214 R |
| 5,373,338 A | | 12/1994 | Betts | 359/189 |
| 5,563,893 A | | 10/1996 | Lai | 714/709 |
| 5,602,504 A | * | 2/1997 | Liu | 327/357 |
| 5,929,689 A | | 7/1999 | Wall | 327/362 |
| 6,057,738 A | | 5/2000 | Ku et al. | 330/308 |
| 6,072,609 A | | 6/2000 | Masuda | 359/110 |
| 6,084,478 A | | 7/2000 | Mayampurath | 330/308 |
| 6,208,446 B1 | | 3/2001 | Faifman | 359/189 |
| 6,218,905 B1 | | 4/2001 | Sanders et al. | 330/308 |
| 6,242,732 B1 | | 6/2001 | Rantakari | 250/214 A |
| 6,275,541 B1 | | 8/2001 | Nagahori et al. | 375/318 |

OTHER PUBLICATIONS

Maxim Integrated Products, "Gbps, High–Speed Limiting Amplifier with Chatter–Free Loss–of–Signal Detection", 19–0324; Rev. 2: 12/97, (pps 1–8).

* cited by examiner

Primary Examiner—Terry D. Cunningham
Assistant Examiner—Long Nguyen
(74) Attorney, Agent, or Firm—Christie, Parker & Hale, LLP

(57) ABSTRACT

A loss of signal detection circuit using Gilbert mixers. A differential input signal is provided to an input Gilbert mixer. Reference signals are provided to a reference Gilbert mixer. The two Gilbert mixers pull reference lines in opposing directions such that a one line is higher than another line when the differential input signal provides valid data.

18 Claims, 2 Drawing Sheets

US 6,559,682 B1

DUAL-MIXER LOSS OF SIGNAL DETECTION CIRCUIT

BACKGROUND

This invention relates generally to electronic circuits, and more specifically to loss of signal detection circuits.

Electronic devices such as digital electronics often contain a number of electronic components. In order for the electronic device to function as intended, data is often transferred between or among the components. Components are often connected by, for example, a bus that allows for communication among the components. Other data propagation schemes such as wireless or optical communications may also be used.

Occasionally, a component or a connection between components may fail. When a failure occurs, a receiving device and downstream devices often lose the incoming signal. That is, rather than receiving the expected signal, a component downstream from a failure may receive no valid signal.

Should a component stop receiving the expected signal, it is often desirable for the component to modify its processing or state. For example, this may allow the equipment to generate an alert informing a user and downstream systems that the signal has been lost, to enter a power saving mode, or to otherwise modify processing performed by the device in view of a loss of signal.

Digital electronic devices often contain a valid signal at a low level, to indicate a logical low, for example. Such a valid low level signal may have an amplitude less than or only slightly higher than that of the noise in the system. Thus, it is generally necessary to accurately distinguish between a low level signal and noise to reliably detect a loss of signal (LOS).

The small currents and the close signal levels involved present difficulties in accurately detecting a LOS. Detecting and monitoring such signals may be difficult in view of process and temperature variations, and may require high power circuits, or complex circuit topologies. Moreover, instantaneous noise may result in an erroneous LOS alert if the magnitude of the noise is large enough.

For example, a buffer with variable hysteresis may be used. Such a circuit may require the creation of a sampling clock, with attendant layout, clock skew, and other difficulties. The frequency of the sampling clock may need to be changed as the data rate changes, possibly resulting in a complex and large circuit. Due to process and temperature variations, an accurate variable hysteresis is often difficult to achieve. The sampling clock and additional circuitry may also increase the power consumption of the circuit. Finally, as the circuit operates at high speed, it may treat transient or instantaneous noise as a valid signal if the noise is large enough.

In other circuits multiple buffers with fixed offsets may be used. Such circuits may include multiple high speed paths. The high speed paths may include logic that generates an LOS alert. The high speed paths and logic often increase the power requirements of the circuit. Due to process and temperature variations, the high speed paths are often difficult to match to one another. Due to difficulties in matching, post processing may need to be performed. Post processing may consume additional power and add further complexity to the circuit. As mentioned above, such a high speed circuit may also respond to instantaneous noise if it is large enough.

Thus, in view of the complications presented by process and temperature variations, power requirements, and circuit topology, implementing an accurate LOS detection circuit is often difficult.

SUMMARY OF THE INVENTION

The present invention provides a dual mixer loss of signal detection circuit. In one aspect, the invention comprises a method for detecting a loss of signal. The method includes providing an input signal to a first Gilbert mixer; providing an offset voltage to a second Gilbert mixer; the Gilbert mixers altering voltages on a plurality of output lines in response to the input signal and the offset voltage; time averaging a plurality of signals of the output lines, producing time averaged outputs; comparing voltages of the time averaged outputs; and generating an alert in response to the comparison of the time averaged outputs.

In another aspect, the invention comprises a circuit for detecting a loss of signal. The circuit includes a plurality of Gilbert mixers; a plurality of output lines, with each Gilbert mixer providing an output to at least two output lines; a filter circuit coupled to the plurality of output lines, producing a filtered output; and a comparator circuit receiving the filtered output and generating an alert signal.

These and other aspects of the invention may be more fully comprehended upon study of the following descriptions in conjunction with review of the accompanying figures.

DETAILED DESCRIPTION

Figure 1:
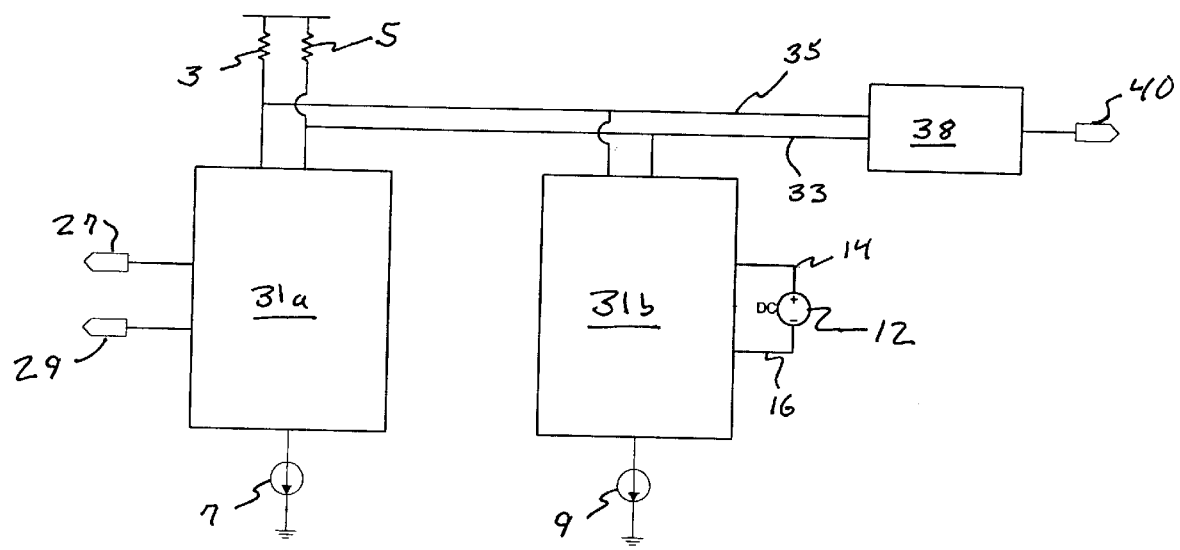
FIG. 1 illustrates a block diagram of a loss of signal detection circuit in accordance with aspects of the present invention.

FIG. 1 is a block diagram of a LOS detection circuit. As illustrated in FIG. 1, the circuit includes an input Gilbert mixer 31a and a reference Gilbert mixer 31b. The input Gilbert mixer receives a differential input data signal. The differential input data signal is provided to inputs 27 and 29. The reference Gilbert mixer receives a substantially constant differential signal. The Gilbert cells, which square their input signals, are connected in what may be viewed as opposing polarity to output lines 33 and 35.

In one embodiment, the constant differential signal, which may be viewed as a DC offset, is less than the amplitude of the valid data signals on the differential inputs. When the differential input signal does not carry data, the reference Gilbert mixer will pull one of the output lines 33, 35, line 33 for example, lower than the other line, line 35 in this example. However, when the differential input signal does carry data, the input Gilbert mixer more than counteracts the reference Gilbert mixer. Thus, the relative magnitudes of the signals on lines 33, 35 will be reversed from the above example. Accordingly, a comparator 38, coupled to the output lines, may be used to determine whether the differential input signal carries data.

In somewhat more detail, the circuit of FIG. 1 includes a true input 27 for a true version of the differential signal, IN.

The circuit also includes a complementary input 29 for a complementary version of the differential signal, INN. The inputs are provided to an input Gilbert mixer 31a.

A first current source 7 is coupled to the input Gilbert mixer. The first current source is configured to pull current from the input Gilbert mixer. The outputs of the input Gilbert mixer are coupled to output lines A 33 and AN 35. In one embodiment, each output of the input Gilbert mixer is tied to one output line. Output lines A 33 and AN 35 are also each tied to power via a resistor. Output line AN is coupled to power by resistor 3. Similarly, output line A is tied to power by resistor 5.

Figure 2:
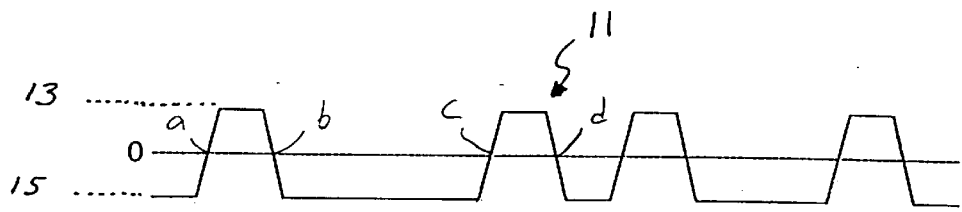
FIG. 2 illustrates an example non return to zero data signal such as may be received by the circuit of FIG. 1.
Figure 3:
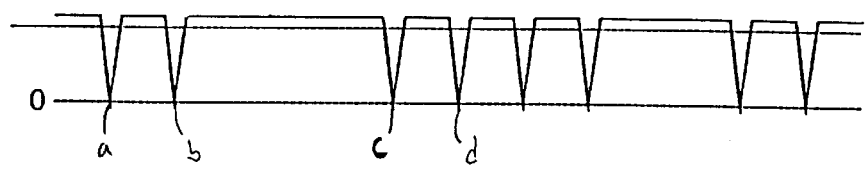
FIG. 3 diagrams a squared version of the non return to zero data signal of FIG. 2.
Figure 4:
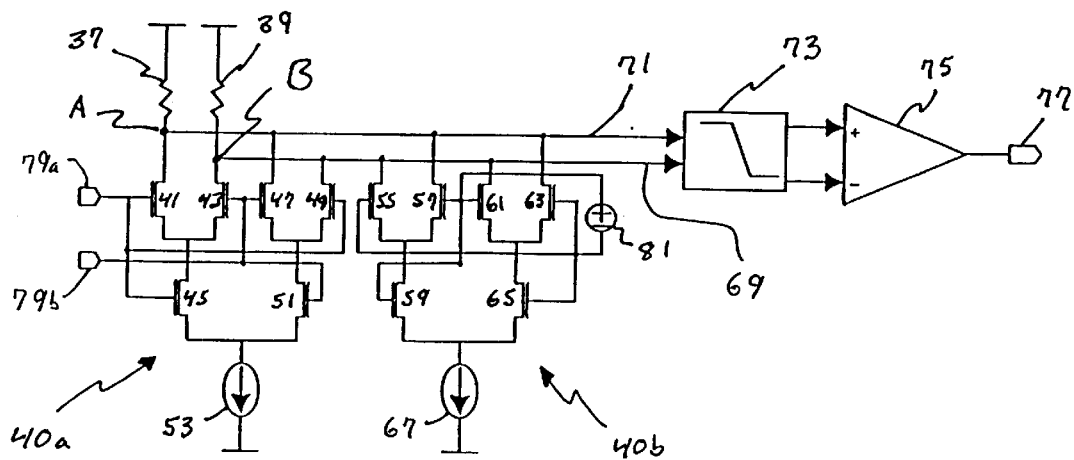
FIG. 4 illustrates a semi-schematic diagram of the loss of signal detection circuit of FIG. 1.

Operation of the first Gilbert mixer may be more fully understood considering the signals of FIGS. 2 and 3. FIG. 2 diagrams a data signal 11 such as might be received by the input Gilbert mixer. For purposes of example, the data signal of FIG. 2 is a non-return to zero (NRZ) signal. The signal is applied to the true input of the input Gilbert mixer. The input Gilbert mixer would also receive a complementary version of the signal of FIG. 2 at its complementary input.

As illustrated, the signal of FIG. 2 varies between a high level 13, and a low level 15. In the example waveform of FIG. 2, the high level is represented by a positive voltage. The low level is represented as a negative voltage. Also, as illustrated, the signal transitions from a low level to a high level at time a. The signal transitions from the high level to a low level at time b. The time from a to b indicates one bit time, with the signal being a logical one during the bit time. After time b until time c the signal remains at a low level. The time between b and c is multiple bit times, three bit times as illustrated. At time c the signal returns to a high level. After one further bit time, at time d, the signal returns to a low level.

FIG. 3 illustrates the output of the input Gilbert mixer when the input Gilbert mixer is provided the signal of FIG. 2. Such an output signal is provided by the input Gilbert mixer, for example, on output line A. The signal of FIG. 3 varies between a high level 16 and a zero level 18. As illustrated, the signal of FIG. 3 is usually at the high level. The signal is initially at the high level, before transitioning to the zero level at time a. The signal quickly returns to the high level before again transitioning to the zero level at time b. The squared signal between times a and b of FIG. 3 corresponds to the input signal between times a and b of FIG. 2.

Similarly, the signal transitions from the high level to the zero level at time c. Again, the signal quickly returns to the high level before again transitioning to the zero level at time d. The squared signal between times b and c of FIG. 3 corresponds to the input signal between times b and c of FIG. 2. Accordingly the signal of FIG. 3 briefly goes to a low state and returns to a high state at times corresponding to transitions in the signal of FIG. 2. Thus, the signal of FIG. 3 is a squared version of the signal of FIG. 2.

Returning to FIG. 1, a reference Gilbert mixer 31b receives a differential DC offset signal. The differential DC offset signal is generated by a voltage source 12 producing a high signal 14 and a low signal 16. A second current source 9 is coupled to the reference Gilbert mixer. The second current source is configured to pull current form the reference Gilbert mixer. Each of the outputs of the reference Gilbert mixer is coupled to one of the output lines. The reference Gilbert mixer produces signals that are proportional to the square of the DC offset signal.

Each of the two Gilbert mixers varies the voltages on both of the output lines. The reference Gilbert mixer causes the voltage on line AN to be higher than the voltage on line A. The input Gilbert mixer causes the voltage on line AN to be greater than the voltage on line A when an input signal is present. Thus, the Gilbert mixers may be considered to be in contention with one another. The input Gilbert mixer varies the voltages on the output lines in response to the differential input signals, IN and INN. The reference Gilbert mixer varies the voltages on the output lines in response to the offset signal.

In one embodiment, the offset signals provided to the reference Gilbert mixer are nearly constant. Therefore, the reference Gilbert mixer produces an output signal which is nearly constant as well. Consequently, the reference Gilbert mixer biases the output lines. The extent to which the reference Gilbert mixer biases the output lines is determined by the offset voltage.

The input Gilbert mixer also varies the voltages of the output lines. The input Gilbert mixer varies the voltages of the output lines based on the input signals. The variation in voltages of the output lines provided by the input Gilbert mixer is dependent on the magnitudes of the input signals. When the difference between the magnitudes of the input signals is greater than the difference between the magnitudes of the offset signals, the voltage on line A is greater than the voltage on line AN. In the absence of an input signal, the input Gilbert mixer is largely inactive. Thus, in this case, the voltages on the output lines are largely determined by the biasing action of the reference Gilbert mixer. The voltage on line AN is therefore greater than the voltage on line A, due to the biasing action of the reference Gilbert mixer.

However, some noise may be present at the inputs of the input Gilbert mixer. If the magnitude of the noise is large enough, it may affect a large voltage change on the output lines. For example, suppose that input IN is ideally at a higher voltage than input INN. Thus, the output lines are in a first state, with output line A at a higher voltage than output line AN, for example. However, suppose that a noise signal of sufficient magnitude is present at input line INN such that input line INN is at a higher voltage than input line IN. Consequently, the state of the output lines may be altered such that output line AN has a higher voltage than output line A. Thus, for some noise levels, the output signals may be affected.

However, for noise levels less than the offset signal, the voltages of the output lines are determined largely by the reference Gilbert mixer when no input signal is present. If an input signal is present, the first Gilbert mixer varies the voltages of the output lines. The voltages of the output lines are therefore determined by both Gilbert mixers when an input signal is present.

The output lines are provided to detection circuitry 38. The detection circuitry compares the voltages of the two output lines. As discussed above, the relative voltages of the output lines may be used to determine if an input signal is present. When the detection circuitry determines that a LOS has occurred, with the voltage in line AN greater than the voltage on line A, the direction circuitry outputs a LOS alert on line 40.

Additionally, the two Gilbert mixers are implemented near each other on the same chip. They are therefore both subject to nearly identical process, environmental, and power supply variations. As the Gilbert mixers are matched in this way, the effects of these variations are reduced in the operation of the LOS circuit.

FIG. 2 illustrates a semi-schematic semi-block diagram of an embodiment of the LOS detection circuit of FIG. 1. The circuit includes an input Gilbert mixer 40a. The circuit additionally includes a reference Gilbert mixer 40b. A first terminal of each of resistors 37 and 39 is connected to a power supply. In the LOS detection circuit, a second terminal of resistor 37 is coupled to a node A. A second terminal of resistor 39 is coupled to a node B. Output line A 69 is taken from node B. Output line AN 71 is taken from node A.

In the reference Gilbert mixer, a drain of transistor 55 is coupled to node A. Transistor 57 has a drain coupled to node B. Sources of transistors 55 and 57 are tied together, forming a first differential pair. Sources of transistors 55 and 57 are coupled to the drain of transistor 59.

Transistors 61 and 63 form a second differential pair. Thus, transistors 61 and 63 are configured in a similar manner to transistors 55 and 57. The drain of transistor 61 is coupled to node A, and the drain of transistor 63 is coupled node B. Sources of transistors 61 and 63 are coupled to the drain of transistor 65. Sources of transistors 59 and 65 are coupled together, forming a third differential pair. Sources of transistors 61 an 63 are coupled to a first terminal of a current source 67.

In operation, a DC offset voltage is provided to the reference Gilbert mixer. The offset voltage is suppled by a voltage source 81. A more positive offset voltage is applied to the gates of transistors 57, 59, and 61. A less positive offset voltage is applied to the gates of transistors 55, 63, and 65. In one embodiment, the offset voltage is chosen such that the transistors operate in their linear range.

In one embodiment, the reference Gilbert mixer has two current paths for draining current from output line A. A first current path includes transistors 63 and 65. Transistors 63 and 65 are connected in series. As noted above, transistors 63 and 65 are both supplied at their gates the less positive offset voltage. Therefore, transistors 63 and 65 are conductive only to a small extent. Accordingly, only a small current passes through the first current path. A second current path includes transistors 57 and 59, also in series. As stated, transistors 57 and 59 are both supplied at their gate the more positive offset voltage. Thus, a large current flows through the second current path. Therefore, the a large current is drawn from output line A. Consequently, a large voltage drop occurs across resistor 39.

The reference Gilbert mixer also has two current paths that allow current to be drained from output line AN. A first current path includes series transistors 55 and 59. Transistor 55 is supplied the less positive offset voltage at its gate, while transistor 59 is supplied the more positive offset voltage at its gate. Transistor 59 is thus highly conductive. However, transistor 55 is only partially conductive, passing only a small amount of current. As transistors 55 and 59 are configured in series, only a small amount of current passes through the first current path. Thus, the voltage of output line AN is substantially unchanged due to current passing through the first current path of the reference Gilbert mixer.

A second current path includes series transistors 61 and 65. Transistor 65 is supplied the less positive offset voltage at its gate, while transistor 61 is supplied the more positive offset voltage at its gate. Transistor 61 is thus highly conductive. However, transistor 65 is only partially conductive, passing only a small amount of current. As transistors 61 and 65 are configured in series, only a small amount of current may pass through the second current path. The total amount of current drawn from output line AN is the sum of the current from each current path. Thus, the total amount of current drawn from output line AN is less than the amount of current drawn from output line A.

Since the current draw from output line AN is less than that of output line A, the voltage drop across resistor 37 is less than that across resistor 39. Output line AN, therefore has a higher voltage than that of output line A. Thus, the output lines are biased at voltages determined by the offset voltage applied to the reference Gilbert mixer.

The input Gilbert mixer has a structure similar to that of the reference Gilbert mixer. A drain of a transistor 41 is coupled to node A. A drain of transistor 43 is coupled to node B. Sources of transistors 41 and 43 are coupled together. Thus, transistor 41, along with transistor 43 form a fourth differential pair. A drain of transistor 45 is coupled to the sources of transistors 41 and 43.

Transistors 47 and 49 form a fifth differential pair. Accordingly, transistors 47 and 49 are arranged in a configuration similar to transistors 41 and 43. Specifically, a drain of transistor 47 is coupled to node A. The drain of transistor 49 is coupled to node B. Sources of transistors 47 and 49 are tied together. The sources are coupled to the drain of transistor 51. Transistors 45 and 51 have their sources tied together, forming a sixth differential pair. Sources of transistors 45 and 51 are coupled to a first terminal of a current source 53.

In operation, the input Gilbert mixer receives both the true and complementary versions of the input signal at input terminals 79a,b. Input terminal 79a receives a true version of the input signal, IN. Input terminal 79b receives a complementary version of the input signal, INN. Input signal IN is provided to the gates of transistors 41, 45, and 49. Input signal INN is provided to the gates of transistors 43, 47, and 51. The input Gilbert mixer operates in a manner analogous to the operation of the reference Gilbert mixer, as described above.

When input signal IN is a logical high, a large current is drawn from output line AN. Similarly, when input signal INN is a logical high, a large current is again drawn from output line AN. A large current drawn from output line AN results in a large voltage drop across resistor 37. This voltage drop reduces the voltage of output line AN below the level of output line A. Thus, while an input signal is present at either input IN or INN, output line A is at a higher voltage than output line AN. As IN and INN are differential signals, either IN or INN will be logically high if a LOS condition does not exist.

In the absence of an input signal, neither input line IN or input line INN is at a logical high. Therefore, a large current is not drawn from output line AN. As stated above, the reference Gilbert mixer biases the output lines such that output line AN is at a higher voltage than output line A.

Both output lines are provided to a low pass filter 73. The low pass filter outputs low-passed versions of the output lines to a comparator 75. The comparator outputs a LOS alert 77 when it is determined that the device is no longer receiving a valid input signal.

The low pass filter removes high frequency fluctuations from the output signals. Assume that the data signal, v, is of the form v=asin($\omega$t). Then, the square of the data signal is:

$$v^2 = \alpha^2 \sin^2(\omega) = \alpha^2(1-\cos^2(\omega t)) = \alpha^2 - \alpha^2\cos^2(\omega t)$$

The first component of the square of the data signal, $\alpha^2$, has no frequency component; it is a DC signal. The second component of the square of the input signal has a frequency twice that of the data signal. Since, according to Fourier theory, any signal can be decomposed into sinusoidal components, the above relationship holds true for most signals.

Low passing the signal removes the frequency-containing component of the square of the input signal, leaving only the DC component. The low-pass filter therefore produces time averaged versions of the output signals. Thus, the low-pass filter removes sudden transients that may result in an erroneous LOS alert.

The time averaged output signals are provided to a comparator 75. The comparator compares the levels of the time averaged output signals. As discussed above, output line AN is at a higher voltage than output line A when no input signal is present. Therefore, the comparator asserts the LOS alert 77 if output line AN has a higher average voltage than output line A. Time averaging the output signals helps to lessen the impact of transient noise and signal glitches on the assertion of the LOS alert.

The present invention therefore provides a circuit for accurately determining when a LOS condition exists in modern communications equipment. Although this invention has been described in certain specific embodiments, it should be understood that the invention may be practiced otherwise than as described. Accordingly, the described embodiments should be viewed as illustrative and not restrictive, the scope of the invention to be determined by the claims, and their equivalents, supported by the application.

What is claimed is:

1. A loss of signal detection circuit comprising:
   a plurality of Gilbert mixers;
   a plurality of output lines, with each Gilbert mixer providing an output to at least two output lines;
   a filter circuit coupled to the plurality of output lines, producing a filtered output; and
   a comparator circuit receiving the filtered output and generating an alert signal.

2. The loss of signal detection circuit of claim 1 wherein a first Gilbert mixer receives an input signal.

3. The loss of signal detection circuit of claim 2 wherein the input signal is a differential signal.

4. The loss of signal detection circuit of claim 1 wherein a second Gilbert mixer receives an offset signal at its input.

5. The loss of signal detection circuit of claim 4 wherein the offset signal is a DC signal.

6. The loss of signal detection circuit of claim 1 wherein the filter circuit is a low pass filter circuit.

7. The loss of signal detection circuit of claim 1 wherein each Gilbert mixer comprises three differential pair of transistors.

8. The loss of signal detection circuit of claim 7 wherein two output differential pair of transistors are coupled to a plurality of the output lines; a third differential pair of transistors coupled to each of the output differential pair of transistors; and the third differential pair of transistors being coupled to a current source.

9. The loss of signal detection circuit of claim 1 wherein each of a plurality of the output lines are coupled to a power supply by a resistor.

10. A method of detecting a loss of signal, the method comprising:
    providing an input signal to a first Gilbert mixer;
    providing an offset voltage to a second Gilbert mixer;
    the Gilbert mixers altering voltages on a plurality of output lines in response to the input signal and the offset voltage;
    time averaging a plurality of signals of the output lines, producing time averaged outputs;
    comparing voltages of the time averaged outputs; and
    generating an alert in response to the comparison of the time averaged outputs.

11. The method of detecting a loss of signal of claim 10 wherein the input signal received by the first Gilbert mixer is a differential signal.

12. The loss of signal detection circuit of claim 9 wherein the second Gilbert mixer biases the plurality of output lines in response to the offset signal.

13. The loss of signal detection circuit of claim 9 wherein the first Gilbert mixer alters a voltage on at least one of the plurality of output lines in response to the input signal.

14. The loss of signal detection circuit of claim 9 wherein time averaging the plurality of signals of the output lines includes passing the plurality of signals of the output lines through a low pass filter.

15. The loss of signal detection circuit of claim 9 wherein comparing voltages of the time averaged outputs comprises providing the time averaged outputs to a comparator.

16. The loss of signal detection circuit of claim 12 wherein the output lines are biased such that a first output line has a higher voltage than a second output line.

17. The loss of signal detection circuit of claim 16 wherein the first Gilbert mixer alters the voltages of the output lines such that the first output line has a lower voltage than the second output line when an input signal is present.

18. The loss of signal detection circuit of claim 17 wherein generating an alert in response to the comparison of the time averaged outputs comprises generating an alert if a time averaged version of the first output line is at a higher voltage than a time averaged version of the second output line.

* * * * *

UNITED STATES PATENT AND TRADEMARK OFFICE
CERTIFICATE OF CORRECTION

PATENT NO. : 6,559,682 B1
DATED : May 6, 2003
INVENTOR(S) : Ian Kyles et al.

It is certified that error appears in the above-identified patent and that said Letters Patent is hereby corrected as shown below:

<u>Title page,</u>
Item [56], References Cited, U.S. PATENT DOCUMENTS, "5,373,338" should be -- 5,373,388 --;
OTHER PUBLICATIONS, "Gbps" should be -- 1 Gbps --;

<u>Column 6,</u>
Line 59, in the formula the 1st "t" is missing. The formula should read as follows:
-- $v^2 = \alpha^2 \sin^2(\omega t) = \alpha^2(1 - \cos^2(\omega t)) = \alpha^2 - \alpha^2 \cos^2(\omega t)$ --

Signed and Sealed this

Twenty-seventh Day of April, 2004

JON W. DUDAS
*Acting Director of the United States Patent and Trademark Office*